United States Patent [19]
McMurray

[11] Patent Number: 4,593,204
[45] Date of Patent: Jun. 3, 1986

[54] DRIVER CIRCUITS FOR GATE TURN-OFF THYRISTORS AND BIPOLAR TRANSISTORS

[75] Inventor: William McMurray, Schenectady, N.Y.

[73] Assignee: General Electric Company, Schenectady, N.Y.

[21] Appl. No.: 565,304

[22] Filed: Dec. 27, 1983

[51] Int. Cl.⁴ .............................................. H03K 17/72
[52] U.S. Cl. .................................. 307/252 C; 307/268; 307/253
[58] Field of Search ................... 307/252 C, 253, 264, 307/268; 323/339, 349, 325, 355

[56] References Cited

U.S. PATENT DOCUMENTS

| | | | |
|---|---|---|---|
| 4,203,047 | 5/1980 | Seki | 307/252 C |
| 4,293,779 | 10/1981 | Nestler et al. | 307/252 C |
| 4,297,594 | 10/1981 | Onda et al. | 307/252 C |
| 4,298,809 | 11/1981 | Onda et al. | 307/252 C |
| 4,488,059 | 12/1984 | Akamatsu | 307/253 |

OTHER PUBLICATIONS

Gating Circuit Developed for High Power Thyristors, IEEE, Power Electronics Specialist Conference Record, 1981, pp. 215-225.
Application Engineering of Gate Turn-Off Thyristors, Hitachi Review, vol. 31 (1982), No. 4, pp. 173-178.

Primary Examiner—John Zazworsky
Attorney, Agent, or Firm—Mark L. Mollon; James C. Davis, Jr.; Marvin Snyder

[57] ABSTRACT

A driver circuit uses magnetic isolation through separate turn-on and turn-off transformers. During turn-on and turn-off a high initial current pulse is followed by steady dc gate bias. All control functions are performed on the low voltage common side of the transformers which are part of a dual mode power converter. The driver circuits are protected against failure of the gate-cathode terminals in the short circuited or open circuited mode.

7 Claims, 18 Drawing Figures

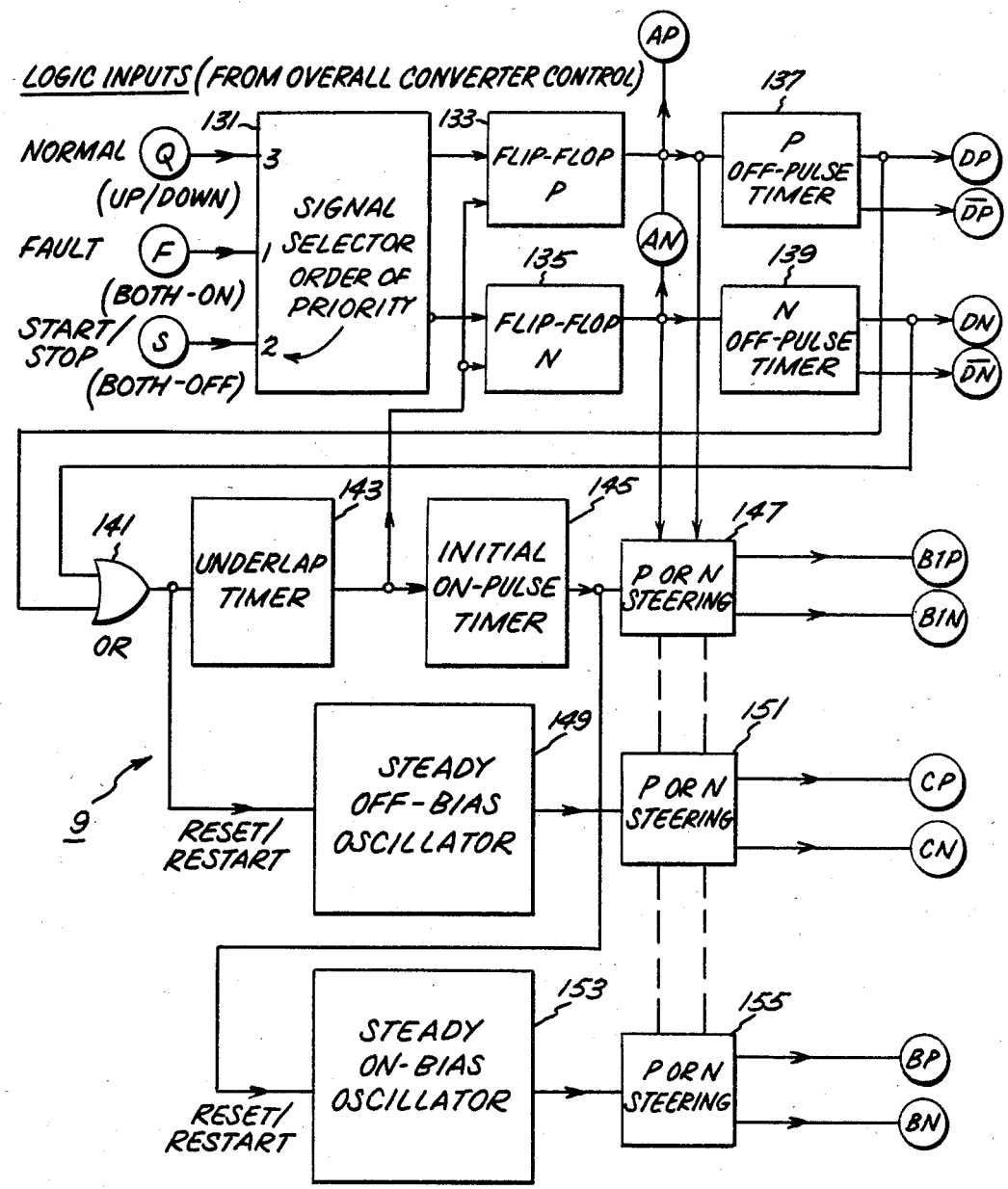

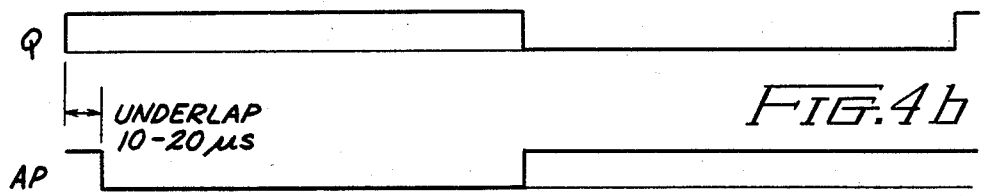
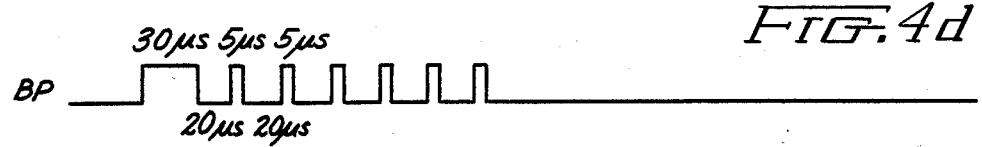
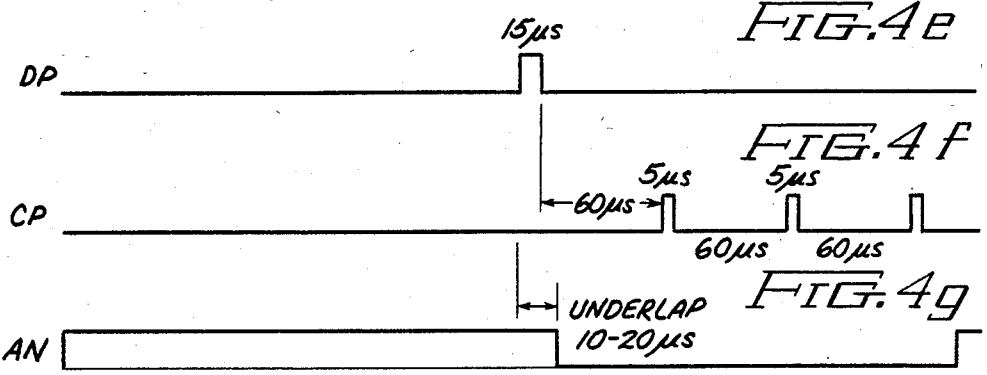
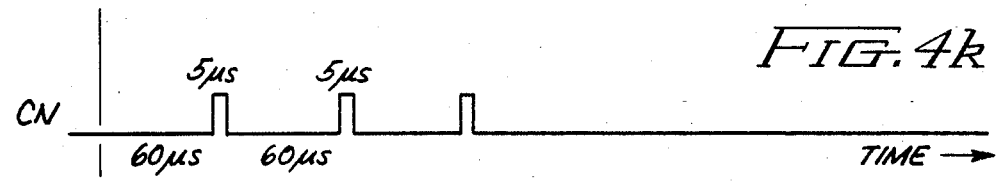

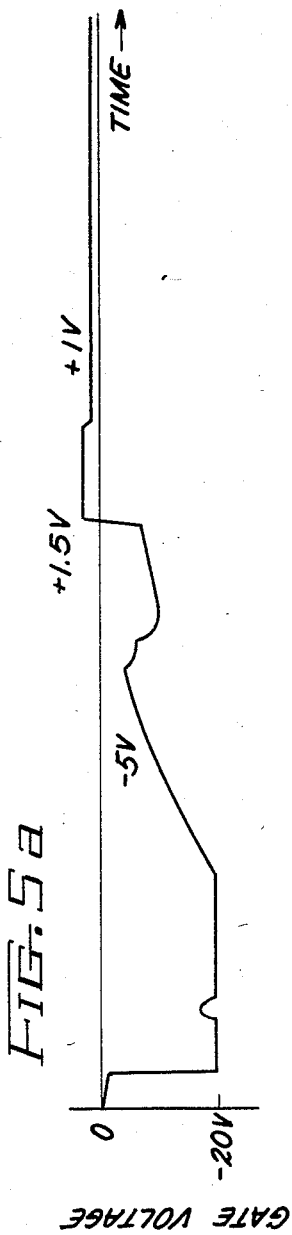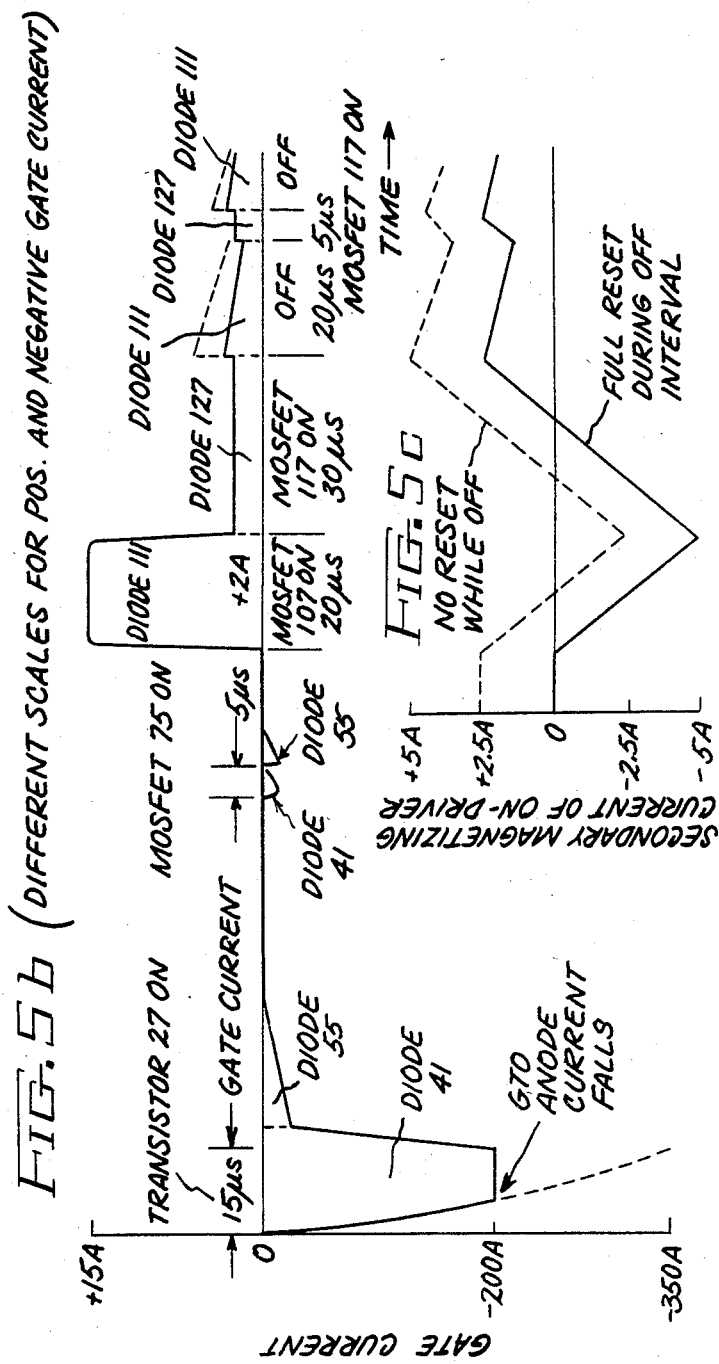

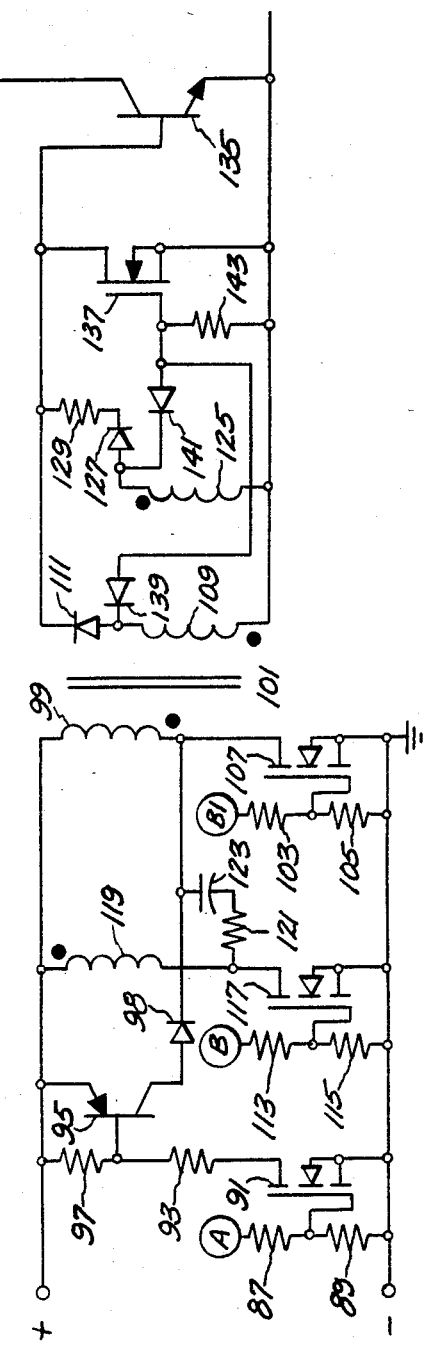

DRIVER CIRCUITS FOR GATE TURN-OFF THYRISTORS AND BIPOLAR TRANSISTORS

BACKGROUND OF THE INVENTION

This invention relates to driver circuits with magnetic isolation for high power semiconductor devices and more particularly to gate driver circuits for gate turn-off thyristors (GTOs) and base driver circuits for bipolar transistors.

Gate turn-off thyristors (GTOs) require gate drive current of both polarities. The initial power required at the instant when the polarity switches is much higher than the steady bias power required to hold the device on or off. Many GTO converter circuits require that the gate driver operate at high variable voltage with respect to ground. The amount of gate power is such that magnetic coupling is the only practical method of power isolation at present. The rise times of the switching current pulses must be short and their timing precise, with minimum delay in response to control signals. In many converter circuits, the on or off time of the GTO may be short (50 μs), so both the on and off drivers must reset quickly to be ready for switching polarity again. This fast-reset feature is also needed for protective schemes in which the GTO may be turned on or off any time in response to detection of a fault. This combination of requirements makes a design of a small, efficient and economical gate driver circuit rather difficult.

It is an object of the present invention to provide a gate driver circuit in which the number of magnetic components is limited to two transformers for each driver circuit.

It is a further object of the present invention to provide a gate driver circuit which avoids the need for any isolation component other than transformers.

It is a still further object of the present invention to provide a gate driver circuit which generates both high current initial pulses and low steady bias power with high efficiency in both polarities.

It is another object of the present invention to provide a gate driver circuit which allows short on or off time by using fast-reset circuits.

It is yet another object of the present invention to minimize the size of a gate driver circuit for a GTO, allowing it to be mounted close to the GTO device since short gate leads allow fast rise times.

It is a further object of the present invention to avoid damage to a gate driver circuit for a GTO in the event of failure of the GTO device by making operation safe with the gate-cathode terminals short-circuited or open-circuited.

It is a still further object of the present invention to provide a driver circuit for a high power bipolar transistor.

SUMMARY OF THE INVENTION

In one aspect of the present invention a gate driver circuit for providing a turn-off pulse and a steady off-bias signal comprises transformer means having a first and second winding on the primary side and a third and fourth winding on the secondary side. Each of the transformer windings is magnetically coupled to each other winding. The first winding is coupled in series with a first controllable switch means and the series combination is adapted to be coupled to a first external power supply. The third winding is coupled through a first diode means to the gate-cathode junction of the GTO. The first winding and first diode means ar poled to provide the reverse gate current turn-off pulse to the GTO when the first controllable switch means conducts. The second winding is coupled in series with second controllable switch means, with the series combination adapted to be coupled to a second external power supply. The fourth winding is coupled through a second diode means to the gate-cathode junction of the GTO. The fourth winding and the second diode means are poled to provide the off-bias signal from magnetic energy in the transformer when one of the first or second controllable switch means is biased out of conduction.

In another aspect of the present invention a gate driver circuit for providing a turn-on pulse and a steady on-bias signal comprises transformer means having a first and second winding on the primary side and a third and fourth winding on the secondary side. Each of the transformer windings is magnetically coupled to each other. The first winding is coupled in series with a first controllable switch means, with the series combination adapted to be coupled to an external power supply. The third winding is coupled through a first diode means to the gate-cathode junction of the GTO. The third winding and the first diode means are poled to provide the gate current turn-on pulse to the GTO when the first controllable switch means conducts. The second winding is coupled in series with the second controllable switch means, with the series combination adapted to be coupled to an external power supply. The fourth winding means is coupled through a second diode means to the gate cathode junction of the GTO with the second diode means and the fourth winding poled to provide the on-bias signal when the controllable switch means conducts. The third winding and the first diode means are poled to provide the on bias signal from the magnetic energy in the transformer when the second controllable switch means is biased out of conduction.

BRIEF DESCRIPTION OF THE DRAWING

While the specification concludes with claims particularly pointing out and distinctly claiming the present invention, the objects and advantages of the invention can be more readily ascertained from the following description of a preferred embodiment when used in conjunction with the accompanying drawing in which:

FIG. 3 is a block diagram of the control circuit of FIG. 1 for generating control signals for a pair of GTO drivers in accordance with the present invention;

FIGS. 4a–k show control signal waveform diagrams all on a common time scale generated by the control signal generator of FIG. 3;

FIGS. 5a–c show waveform diagrams all on a common time scale of the waveforms produced by the gate driver circuit shown in FIG. 2; and FIG. 6 is a schematic represenation of the gate driver circuit of FIG. 2 coupled to a high power bipolar transistor in accordance with the present invention.

DETAILED DESCRIPTION OF THE DRAWINGS

Figure 1:
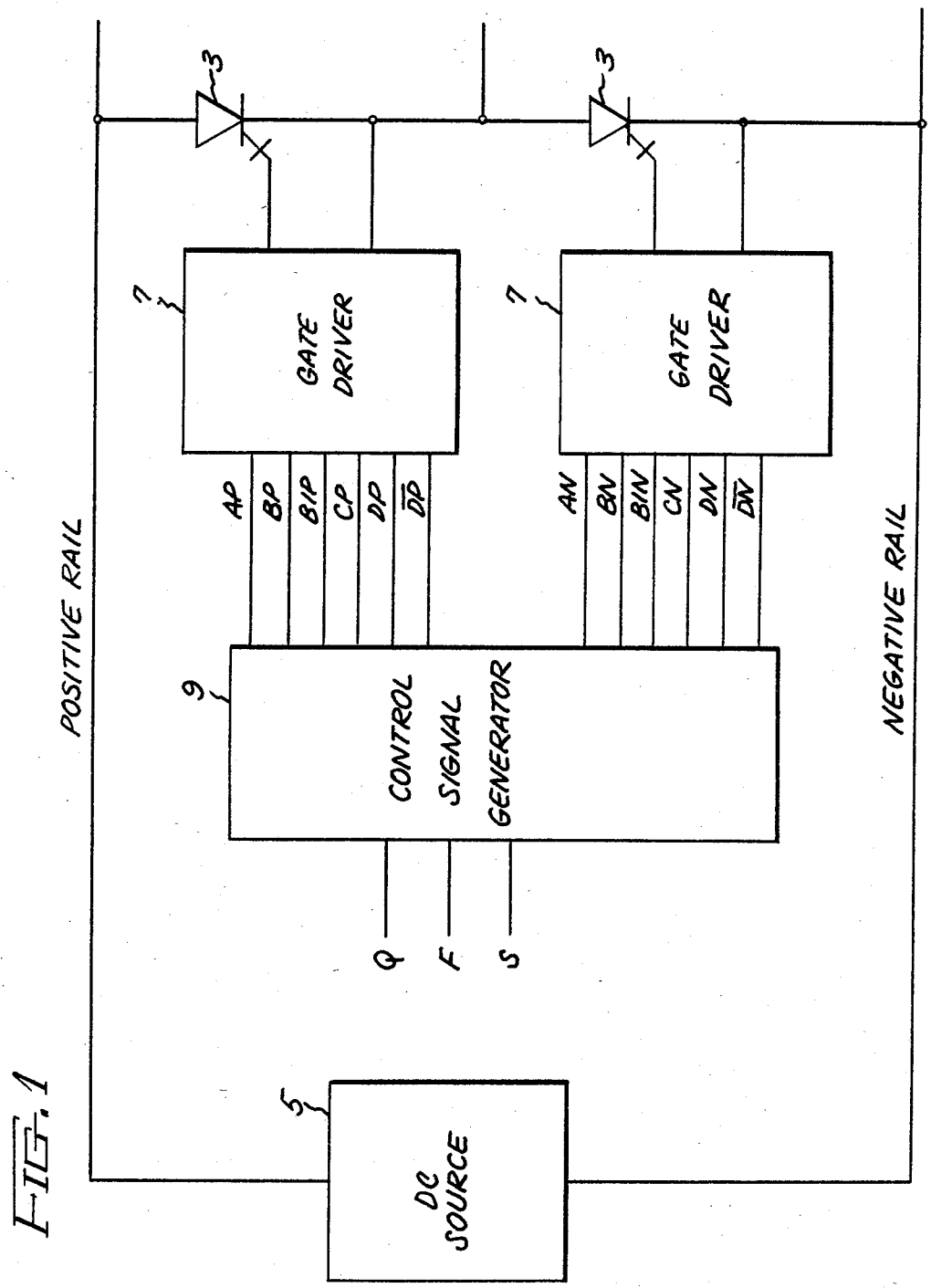
FIG. 1 is a part schematic part block diagram representation of a single leg of a GTO converter with two series connected GTOs, their associated gate drivers and control signal generator in accordance with the present invention.

Referring now to the drawings in which like numerals indicate like elements throughout and especially FIG. 1 thereof, a single leg of a multi-leg converter having two series connected GTOs 3 connected between a positive and a negative dc rail is shown. The positive and negative dc rails are connected to a high voltage dc power source 5. A gate driver circuit 7 is coupled to the gate-cathode terminals of each of the GTOs 3, respectively. A control signal generator circuit 9 provides control signals AP, BP, B1P, CP, DP and $\overline{DP}$ and AN, BN, B1N, CN, DN and $\overline{DN}$, associated with the positive and negative rails, respectively, to each of the gate drivers responsive to logic signals Q, F and S from an overall converter controller, not shown.

Figure 2:
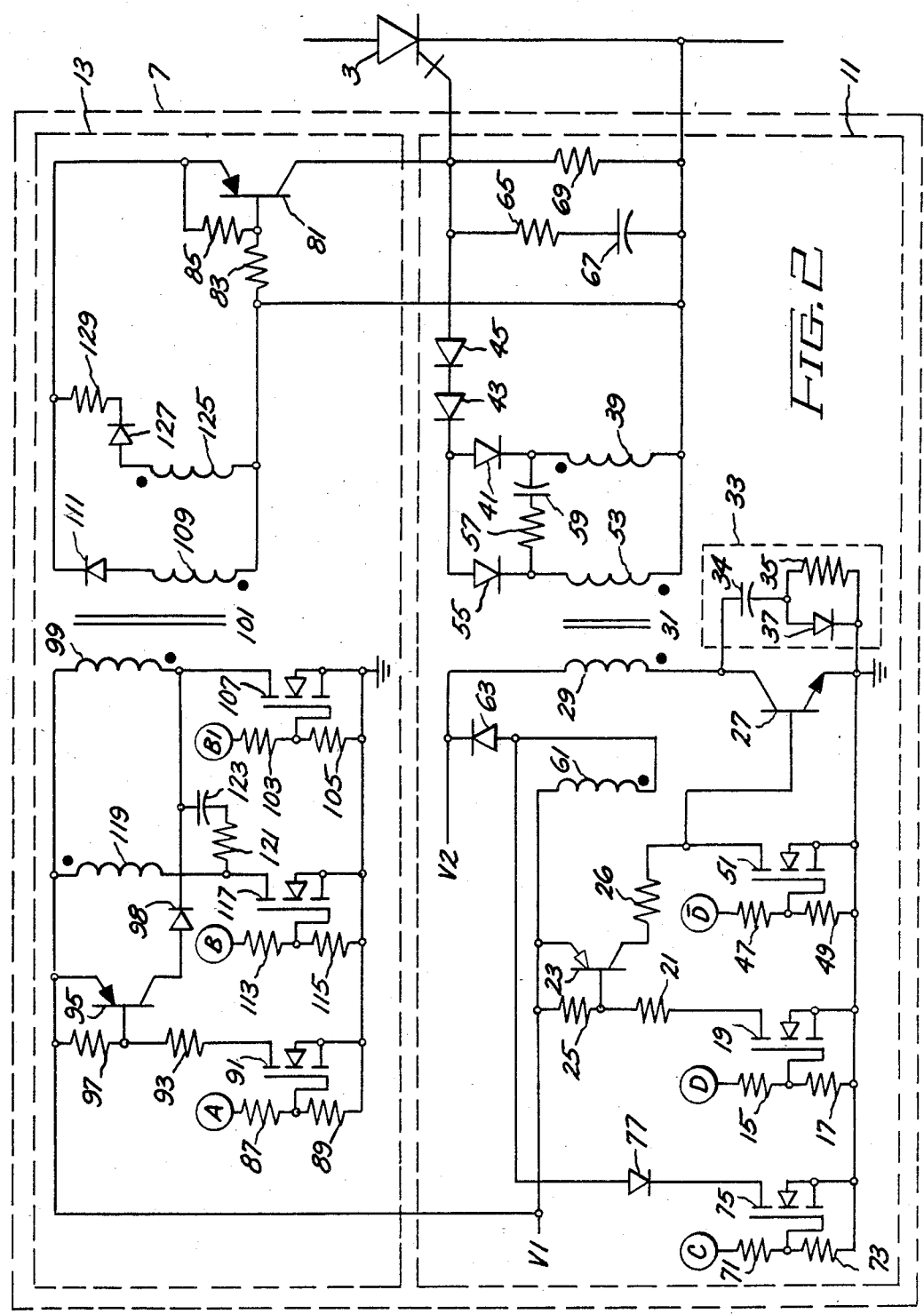
FIG. 2 is a schematic representation of the gate driver circuit of FIG. 1 in accordance with the present invention.

Referring now to FIG. 2 a schematic representation of the gate driver 7 is shown. The gate driver comprises an off-driver circuit 11 and an on-driver circuit 13. A control signal D from control signal generator 9 is coupled through a voltage divider comprising resistors 15 and 17, to ground. The gate of a n-channel MOSFET 19 is coupled to the junction of resistors 15 and 17. The drain of MOSFET 19 is coupled through a resistor 21 to the base of a pnp bipolar transistor 23 and the source of MOSFET 19 is coupled to ground. The base of transistor 23 is also connected through a resistor 25 to the emitter of transistor 23 and a power supply V1. The collector of transistor 23 is coupled to the base of a transistor 27 through a resistor 26. The emitter of transistor 27 is coupled to ground and the collector of transistor 27 is coupled to a winding 29 of a multi-winding transformer 31 to a power supply V2 which has a magnitude greater than power supply V1. A polarity marker dot shown on the end of winding 29 connected to the collector of transistor 27 shows the relative instantaneous voltages of the different transformer windings. When a winding is connected to a source of power the dotted end of the other windings of the transformer have the same polarity relative to the other end of their windings as the dotted end of the winding connected to the source of power has to its other end. Transformer 31 comprises a four winding transformer which can be fabricated, for example, with standard ferrite EC-cores. EC cores are available, for example, from Ferroxcube of Saugerties, N.Y. A polarized snubber 33 is coupled across the collector-emitter terminals of transistor 27. The polarized snubber comprises a capacitor 34 in series with the parallel combination of resistor 35 and a diode 37. The snubber provides transistor protection during turn-off. The cathode of the diode is connected to the emitter of transistor 27.

A winding 39 of transformer 31 together with three series connected diodes 41, 43 and 45, respectively, is coupled across the gate-cathode terminals of GTO 3. The end of winding 39 coupled to the cathode of diode 41 has the polarity marker dot. The series combination of a resistor 65 and a capacitor 67 is also coupled across the gate and cathode terminals of GTO 3 as is a resistor 69.

A control signal $\overline{D}$ is coupled through a voltage divider, comprising resistors 47 and 49, to ground. The gate of an n-channel MOSFET 51 is coupled to the junction of resistors 47 and 49 and the source of MOSFET 51 is coupled to ground. The drain of MOSFET 51 is coupled to the junction of resistor 26 and the base of transistor 27. A winding 53 of transformer 31 is coupled in series with diodes 43, 45 and 55 across the gate-cathode junction of GTO 3. Diode 55 has its cathode coupled to the winding 53. The end of winding 53 with the polarity marker dot is coupled to the cathode of GTO 3. An RC snubber, comprising a resistor 57 and a capacitor 59 in series, is connected between the cathodes of diodes 55 and 41. The function of the RC snubber is to reduce the voltages induced across the diodes during circuit operation.

The winding 61 of transformer 31 has one end coupled to power supply V1 and its other end coupled through a diode 63 to power supply V2. The end of winding 61 having the polarity marker dot is coupled to the anode of diode 63. A control signal C is coupled through a voltage divider comprising resistor 71 and 73, to ground. The gate of a n-channel MOSFET 75 is coupled to the junction of the resistors. The source of the MOSFET 75 is coupled to ground and the drain is coupled to a diode 77 having its anode coupled to the anode of diode 63.

In on-bias driver 13, a pnp bipolar transistor 81 decouples the on-bias driver 13 during off-bias driver 11 operation. The collector of transistor 81 is coupled to the gate of GTO 3 and the base of transistor 81 is coupled through a resistor 83 to the cathode of GTO 3. A resistor 85 couples the base of transistor 81 to its emitter.

A control signal A is coupled through a voltage divider, comprising resistors 87 and 89, to ground. The gate of an n-channel MOSFET 91 is coupled to the junction of resistors 87 and 89. The source of MOSFET 91 is coupled to ground, and the drain is coupled through a resistor 93 to the base of a pnp bipolar clamping transistor 95. The base and emitter of transistor 95 are coupled together through a resistor 97. The emitter of transistor 95 is also coupled to power source V1. The collector of transistor 95 is connected through a diode 98 in series with a winding 99, of multi-winding transformer 101, to power source $V_1$. The diode 98 has its cathode connected to the end of winding 99 having the polarity marker dot.

One end of winding 109 of transformer 101 having the polarity marker dot is connected to the cathode of GTO 3 and the other end is coupled in series through forward-connected diode 111 and the emitter-collector terminals of transistor 81 to the gate of GTO 3.

A control signal B1 is coupled through a voltage divider comprising resistors 103 and 105, to ground. The gate of an n-channel MOSFET 107 is coupled to the junction of resistors 103 and 105. The source of MOSFET 107 is coupled to ground and the drain is coupled through winding 99 of transformer 101 to power source V1.

A control signal B is coupled through a voltage divider, comprising resistors 113 and 115, to ground. The gate of an n-channel MOSFET 117 is coupled to the junction of resistors 113 and 115. The source of MOSFET 117 is coupled to ground and the drain is coupled through a winding 119 of transformer 101 to power source V1. The end of winding 119 coupled to the power source V1 has the polarity marker dot. The drain of MOSFET 117 is also coupled through an RC snubber, comprising series-connected resistor 121 and capacitor 123, to the cathode of diode 98.

A winding 125 of transformer 101 is coupled at one end to the cathode of GTO 3 and the other end is coupled through a series combination of a diode 127 and resistor 129 to the emitter of transistor 81. The end of winding 125 with the polarity marker dot is coupled to the anode of diode 127.

Operation of FIG. 1 will now be broadly described. The control signal generator 9 generates control pulses A, B, B1, C, D and $\overline{D}$ for a pair of driver circuits used to switch the complementary pair of GTOs 3 and in the half bridge converter leg. The control signal generator 9 is responsive to the leg polarity signal Q produced by the overall converter control circuit (not shown) and the control signal generates the pulse waveforms shown in FIGS. 4a–k. Suffixes P and N denote signals for the GTO devices connected to the positive and negative rails of the dc supply 5, respectively. Typical output waveforms of the driver to the gate cathode terminals of the GTO are shown in FIGS. 5a–c. The operation of the gate driver 7 and control signal generator 9 will be described in more detail below.

The operation of the driver circuit in FIG. 2 will now be explained. The load of the driver circuit is the gate-cathode junction of the GTO thyristor which can be regarded as a diode having a very high reverse recovery current which depends on the main anode-cathode current, and a reverse avalanche (Zener) voltage. For a Toshiba SG600R21 device rated at 600 amps turn-off, 1300 volts peak, the reverse avalanche voltage is about 20 volts. Typical voltages will be described in the following description suitable for use with Toshiba SG600R21 GTOs as an example.

The driver circuit of FIG. 2 includes an off-driver circuit 11 for providing a high initial current turn-off pulse followed by a steady dc gate turn off bias, and a turn-on driver circuit 13 for providing a high initial current turn-on pulse followed by a steady dc gate turn-on bias. Operation of the turn off driver circuit 11 will be described first.

The high power initial off pulse is generated by biasing transistor 27 into conduction responsive to control signal D via the amplifier stages of MOSFET 19 and transistor 23 while MOSFET 51 is biased out of conduction by control signal $\overline{D}$. The conduction of transistor 27 couples winding 29 of transformer 31 across the high voltage (160 volt) power supply V2, inducing a lower voltage (25 volts) in winding 39 by forward converter action that causes reverse gate current in GTO 3 to flow via rectifier diodes 41, 43, and 45. The gate current is shown graphically in FIG. 5b with the resulting gate voltage shown in FIG. 5a on a common time scale. Forward converter action refers to energy transfer between a power source connected to a winding, directly to another winding connected to a load. Diodes 43 and 45 are included to decouple the off-driver 11 when the on-driver 13 is operating. During the storage time of GTO 3, the gate impedance is very low and the reverse gate current rises rapidly (40 A/µs) limited mainly by the leakage inductance between transformer windings 39 and 29.

Recovery of the gate-cathode junction coincides with the fall time of the anode current, and the gate voltage rises quickly to the avalanche level. For example, when turning off an anode current of 600 A, the gate current reaches about 31 200 A. After recovery, the gate current may continue to rise more slowly or start to fall, depending on whether the voltage induced in winding 39 is higher or lower than the avalanche voltage, until transistor 27 is turned off. The off-pulse (15 µs) of control signal D is selected to match the greatest storage-plus-fall time specified for the GTO.

Referring to FIG. 5b, with the output of the gate drive circuit short-circuited, the gate driver circuit attains −350 A in 15 µs, as indicated by the dashed line.

Flyback converter action refers to energy transfer from a winding after the power source is disconnected from the winding, to a load connected to another winding, with no overlap of the time energy is introduced in one winding and the time it is transferred to another winding. When control signal D goes low, MOSFET 19 and transistor 23 are biased out of conduction, while MOSFET 51 is biased into conduction by $\overline{D}$ and short circuits the base-emitter terminals of transistor 27, speeding its turn-off with the assistance of polarized shunt snubber 33. As the transformer voltage reverses, the current in winding 39 drops quickly but the magnetizing current built up in winding 29 is transformed into winding 53 and diode 55 by flyback action producing a "tail" of gate current designed to continue during the tailing interval of the anode current.

Energy trapped in the leakage inductance associated with the primary winding 29 will produce a voltage spike across transistor 27, limited by the snubber capacitor 34 and the clamping action of winding 61 connected via diode 63 between the V1 (+36 V) and V2 (30 160 V) power supplies. In case the gate lead of the GTO 3 fails open-circuited, the magnetizing energy of the transformer must be extracted by this primary-side clamp comprising winding 61 and diode 63 coupled between the power supplies V1 and V2.

The initial value of the gate tail current is determined by the air gap in the transformer core and the turns in winding 53. While this current flows, the gate cathode junction of GTO 3 is maintained in avalanche and the voltage drives the current to zero in a near-linear fall. The off-bias filter capacitor 67 is charged to the gate avalanche voltage; resistor 65 damps oscillations with the transformer inductance. When diode 55 blocks at the end of the tail, capacitor 67 begins to discharge through resistor 69 in parallel with the leakage current of the gate-cathode junction of GTO 3. Note that the magnetic flux in transformer 31 has been completely reset to zero at this time (about 45 µs after the start of the off-pulse) so that another off-pulse could be generated immediately, if necessary.

During the remaining off-interval, the desired off-bias voltage (−5 V) is maintained by periodically pulsing MOSFET 75 into conduction to charge capacitor 67. Relative to the iniial off-pulse, MOSFET 75 energizes transformer winding 61 from a lower voltage (36 V) and for a shorter time (5 µs). Since the gate impedance is now high, the pulse energy included in winding 39 is very much reduced and easily absorbed by capacitor 67 at a voltage less than the avalanche level. If the voltage on capacitor 67 has decayed to less than the voltage induced from winding 61 to winding 39 when MOSFET 75 is conducting, some energy is transferred by forward action via diode 41. In any case, magnetizing energy is transferred by flyback action via winding 53 and diode 55 when MOSFET 75 turns off.

The function of diode 77 is to prevent reverse voltage from appearing across the drain-to-source terminals of MOSFET 75 during the initial pulse, when the voltage induced in winding 61 forces its dot end below ground potential. Note that only one off-bias pulse for GTO 3 is shown in FIG. 5b, when MOSFET 75 is on. The repetition period is of the same order as the RC time constant of capacitor 67 and resistor 69. In summary, the off-bias driver operates as a dual mode (forward/flyback) dc converter in the discontinuous current regime.

During the on-interval of the GTO, operation of the off-driver 11 is suppressed, but its output circuit remains in shunt with the now forward biased gate-cathode junction. By inserting one or more extra diodes (diodes 43 and 45) the threshold of conduction can be raised so that negligible turn-on current is diverted into the off-driver. During the steady on-bias interval, only one extra diode is needed for decoupling. However, during the high initial turn on pulse, the gate voltage is raised from about 1 V to 1.5 V by both the higher gate current and dynamic interaction with the rapid rise of anode current to the high peak due to snubber discharge. Since this is the time when diversion of gate current is most undesirable, a second extra diode is necessary (diode 45). Alternatively, a thyristor switching device could be used having its anode coupled to the gate of the GTO 3 and its cathode coupled to one end of the secondary windings and the gate coupled to the other end of the secondary windings through the appropriate diodes; however, the turn-off pulse is degraded by the turn-on delay and switching loss of the thyristor.

While the controllable switching devices are shown as MOSFET and bipolar transistors, the circuit of FIG. 2 can be implemented with all MOSFET or all bipolar transistors or combinations of different types of controllable switching devices.

The operation of the on-driver 13 circuit will now be described. Throughout the on-interval, clamp transistor 95 and its driver MOSFET 91 are held nonconductive. The initial on-pulse is generated by biasing MOSFET 107 into conduction responsive to control signal B1, energizing winding 99 of transformer 101. The voltage induced in winding 109 (6 V) is polarized for diode 111 to conduct, biasing switching transistor 81 into conduction and supplying forward gate current to the GTO 3. Since the resistance in this path is low, the initial on-current is limited (to about 15 A) mainly by the roll-off in gain of transistor 81. The duration of the on-pulse (20 $\mu$s) is sufficient to allow complete turn on of the GTO 3.

After producing the initial pulse, MOSFET 107 is turned off and remains off until the next initial on-pulse. The magnetizing current built up in winding 99 during the initial pulse is now transferred by flyback action into winding 125 and continues the gate current via diode 127 and transistor 81. The voltage across the winding 125 is limited to 6 V by conduction of the inherent reverse diode within MOSFET 117 in series with winding 119. The gate current is limited by resistor 129 and the voltage drops of diode 127, transistor 81 and the gate-cathode junction of GTO 3 to about 2 A, the desired steady on-bias value. Any magnetizing current in excess of this level is transformed into winding 119 and the inherent reverse diode within MOSFET 117, but it is soon driven to zero by the opposing voltage.

At this time, MOSFET 117 (which was biased into conduction by control signal B at the same time as MOSFET 107 was biased out of conduction) begins to conduct, and maintains 2 A gate current by forward action. The magnetic flux in the core and the air gap of transformer 101 is driven into the opposite polarity until, after about 30 $\mu$s, it reaches the level desired for steady on-bias operation and MOSFET 117 is turned off. This flux level corresponds to about 2.5 A magnetizing current referred to winding 109, where it appears by flyback transfer from winding 119 when MOSFET 117 goes off. Any excess voltage on MOSFET 117 during the transfer, due to the leakage inductances, will be limited by the inherent reverse diode within MOSFET 107 associated with winding 99.

However, excess voltage should not appear on MOSFET 117 because the resistance in the path through winding 109 and diode 111 is very low, and the collector-emitter voltage of transistor 81 is low (saturated) at 2 A. Thus, the utilization of magnetic flyback energy is very efficient in maintaining on-bias gate current. Typically the gate current may decay from 2.5 A to 1.5 A in about 20 $\mu$s.

MOSFET 117 is now pulsed into conduction again, providing a gate current of 2 A by forward action through windings 125, resistor 129, diode 127 and transistor 81. At the same time, the magnetic energy is restored in about 5 $\mu$s, where upon MOSFET 117 is cut off and another flyback interval begins with an initial current of 2.5 A in winding 109 and diode 111. This cycle is repeated during the remainder of the on-interval: the on bias driver operates as a dual mode dc converter in the continuous current regime, providing an average gate current of 2 A. The description of the first few cycles assumes that the magnetic flux in transformer 101 is initially zero (fully reset) as implied by the solid-line magnetizing current waveform shown in FIG. 5c.

When a turn-off signal is received, MOSFET 117 (if conducting) is cutoff immediately, and, at the same time, off-pulse transistor 27 is biased into conduction. If no other action were taken in the on-driver circuit 13, the result would be disastrous. The magnetic energy of transformer 101 would continue to drive current in the flyback mode through winding 109, diode 111 and transistor 81. When the GTO 3 is biased out of conduction, the collector of transistor 81 is pulled down to the gate avalanche voltage (+20 V). With substantial base current remaining in transistor 81, the off-driver circuit 11 would supply a large emitter-collector current, storing more magnetic energy in transformer 101 via winding 109. At the end of the high initial off-pulse, the stored energy in transformer 101 would be sufficient to overpower the off-bias and bias the GTO into conduction again.

It is, therefore, essential to quickly remove the flyback mode base drive from transistor 81 and maintain it off throughout the off-interval. This is accomplished by turning on clamp transistor 95 via its driver MOSFET 91, short circuiting winding 99 through the saturated emitter-collector of transistor 95 and the forward drop of the series diode 98 (required to prevent reverse voltage on transistor 95 during on-driver circuit operation). Aided by a 6:1 turns ratio advantage, this provides a lower impedance path than winding 109, the forward-biased diode 111 and the base-emitter path through transistor 81.

The magnetizing current of transformer 101 is therefore, transferred from winding 109 to winding 99, where it decays relatively slowly as the magnetic energy is dissipated by losses, resetting the flux toward zero. The amount of flux remaining at the beginning of the next on-interval depends on the value trapped at turn-off and the duration of the off-interval. With very little flux reset while off, the flux at the start of the new on-interval may follow the dashed line in FIG. 5c where the flux scale is marked in terms of current referred to one secondary winding. Because the initial on-pulse drives flux in the opposite direction from the steady on-bias offset, there is no danger of saturation. The transformer can be designed so that its saturation flux corresponds to 5 A magnetizing current in a secondary winding, and the on-bias level is, then, half-saturation.

The major effect of initial offset flux in the operation of the on-driver is to raise the level of gate current during the first few flyback intervals, as indicated by dashed lines in FIG. 5c. The extra losses associated with the higher current will cause the flux and current to soon decay to the normal average level. This level is sensitive to the on/off duty ratio of MOSFET 117 and impedances in the circuit, including the gate of the GTO. By shortening the first conduction period of MOSFET 117 to less than 30 μs, the initial flyback current can be made less than average.

Operation of the on-driver can be rapidly terminated at any time by biasing MOSFETs 107 and 117 out of conduction and biasing MOSFET 91 and transistor 95 into conduction. The circuit can be restarted at any time, provided that the total cycle period does not approach the initial transient interval of 50 μs. In conjunction with the off driver circuit 11, it is possible to obtain a "notch" width as short as 50 μs for a PWM inverter or dc chopper, such as may be required when the chopping frequency is about 1 kHz.

Operation of the on-driver circuit with a failed GTO load should differ very little from normal operation, since the change in impedance is small. If the gate-cathode junction is short-circuited, some increase in current can be expected. If the GTO failure results in an open gate lead, the on-driver current will be diverted to the off-driver and slightly reduced in value. In either case, the gate driver should survive undamaged.

Proper operation of both the on-and-off driver circuits, as described here, depends on transformers having low leakage between their multiple windings. Windings between which coupling is critical should be adjacent. Coils wound in the order of winding 39, 53, 29 and 61 for transformer 31 and winding 125, 109, 99 and 119 for transformer 101, should result in the optimum configuration. For example, close coupling between windings 109 and 99 of the on driver 13 transformer 101 is desirable to achieve both a fast-rising initial turn-on pulse and rapid transfer of magnetizing current at turn-off.

Alternatively transformer 31 can comprise a two winding primary and a tapped single winding secondary and transformer 101 can comprise a tapped single winding primary and a tapped single winding secondary.

The operation of the control circuit 9 of FIG. 3 will now be described. The control circuit of FIG. 3 provides all the necessary pulse signals for controlling the pair of gate drivers 7 in the inverter phase leg, shown in FIG. 1 according to the waveform diagrams shown in FIGS. 4a–4k.

The input logic functions are:
Q UP-DOWN logic for normal phase leg operation.
F Fault signal: normally high; goes low to turn on both GTOs when a "fire-all to share the surge" method of protection is used.
S START/STOP signal: initially low to hold both GTOs off; goes high to start normal operation; goes low to turn both GTOs off.

The input logic signals Q, F, and S are first processed by Schmitt Triggers (not shown) in signal selector 131 to improve noise immunity and ensure sharp level transition, since the overall converter control circuit may be located some distance from the driver circuits and control circuit 9.

The signal selector 131 sets the order of priority F, S, Q, for the signals received as input signals:
"both-on" overrides "both-off" which overrides normal operation. The output logic signal from signal selector 131 is coupled to a flip-flop 133 and the complement output logic signal from signal selector 131 is coupled to a flip flop 135. Flip-flops 133 and 135 can comprise data type flip-flops. The flip-flops 133 and 135 are direct set to turn off the P or N GTO in FIG. 1, respectively, [where the P GTO is the GTO connected to the positive rail and the N GTO is the GTO connected to the negative rail] immediately upon a Q-level transition by outputting an AP or AN signal, respectively. The output of the flip-flop 133, in addition to providing an A control signal to the upper GTO driver circuit, provides a signal to an off-pulse timer 137. The output of flip-flop 135, in addition to providing an A control signal to the lower GTO driver circuit, provides a signal to an off-pulse timer 139.

The duration of the initial off pulses are timed in off-pulse timers 137 and 139 which can comprise monostable multivibrators. Off-pulse timers 137 and 139 generate output signals DP and DN, respectively, and their complements DP and DN. The outputs DP and DN are combined in an OR gate 141 and the output of this OR gate is coupled to an underlap timer 143. Either off-pulse signal DP or DN starts the underlap timer 143 which can comprise a monostable multivibrator. The output of the underlap timer is coupled to the clock inputs of flip-flops 133 and 135 to reset them and to initially start an on-pulse timer 145. The underlap timer assures that "shoot through" (i.e., one of two series connected thyristors turning on before the other turns off, providing a low impedance path between the dc rails) will not occur by providing an underlap of the ON signals by overlapping the OFF signals. This plan holds the ON driver circuit off for a predetermined delay after the transition of signal Q and delays the on-pulse B1 for the underlap period. The output of the initial on-pulse timer 145 is steered to output B1P or B1N by a P or N steering circuit 147 which in addition to receiving the initial output signal from the on-pulse timer 145 receives the control signals AP and AN from flip-flops 133 and 135, respectively. The output of OR gate 141 is coupled to a steady off-bias oscillator 149 which provides a steady off-bias pulse train with a C on interval (i.e. interval in which the C signal is present) [5 μs] and a C off interval (i.e. an interval in which the C signal is absent) [60 μs]. The C on signal is steered to output CP or CN, as appropriate, by P or N steering circuit 151 which, in addition to receiving the C signal from the steady off bias oscillator 149 also receives the control signals AP and AN which determine where the C signal is to be steered. The steady off bias oscillator is reset during a DP or DN pulse interval and then restarted, beginning with a C off interval.

A steady on-bias pulse train is generated by steady on-bias oscillator 153 which is reset during every underlap interval and restarted after the initial on pulse interval by a signal from the initial on pulse timer 145. The first B on signal provided after restarting the steady on-bias oscillator is 30 μs long, but subsequent B on signals are reduced to 5 μs each and all B on intervals are separated by B off intervals of 20 μs. The B on signal from the steady on bias oscillator 153 is directed to output BP or BN, as appropriate for the on GTO by P or N steering circuit 155. Steering circuit 155 in addition to receiving the output signal of steady on-bias oscillator 153 also receives the output signals of flip-flops 133 and 135.

FIGS. 4a–4k show the waveform diagrams for signals Q, AP, B1P, BP, DP, CP, AN, B1N, BN, DN and CN, respectively, on a common time scale for normal operation in response to signal A. If a fault signal F or a start/stop signal S is received, the operation of control circuit 9 is modified.

Referring to FIG. 6, the circuit 7 of FIG. 2 is shown coupled to a high power NPN bipolar transistor 135.

In addition, a depletion-mode n-channel MOSFET 137 with approximately 1 ohm of resistance when conduction without any voltage applied to it together with diodes 139 and 141 and discharge resistor 143 have been added to circuit 7. The drain of MOSFET 137 is coupled to the cathode of diode 111 and the source is coupled to the dotted end of winding 109. The gate of MOSFET 137 is coupled through diode 139 to the junction of diode 111 and winding 109. The gate is also coupled through diode 141 to the junction of diode 127 and winding 125. Resistor 143 couples the source of MOSFET 137 to its gate.

In operation the depletion-mode n-channel MOSFET 137 is normally conducting and short-circuits the base emitter junction of transistor 135. When transformer 101 is energized by pulsing MOSFET 107 or 117 into conduction, the gate source voltage of MOSFET 137 is driven negative via diodes 139 or 141, biasing MOSFET 137 out of conduction. To bias transistor 135 out of conduction, MOSFET 107 and 117 are biased out of conduction while transistor 95 and MOSFET 91 are biased into conduction to short circuit winding 99 and rapidly de-energize the secondary side of transformer 101. This cuts off base current to transistor 135 and MOSFET 137 is biased into conduction when its gate-source and gate-drain capacitances discharge through resistor 143. The base-emitter voltage of transistor 135 drives reverse gate current through MOSFET 137, biasing transistor 135 out of conduction quickly. Turn-on operation of circuit 13 would be similar to the operation already described in connection with FIG. 2. However, bipolar transistor 135 turn-off current would typically be of the same magnitude as the turn-on pulse.

The foregoing describes a gate driver circuit that uses only two transformers and avoids the need for any other isolation components and which avoids damage by making operation safe with the gate-cathode terminals of the thyristor being driven short-circuited or open-circuited.

While the invention has been particularly shown and described with reference to reveal embodiments thereof, it will be understood by those skilled in the art that various changes in form and details may be made without departing from the spirit and scope of the invention.

What is claimed is:

1. A gate driver circuit for providing a turn-off pulse and a steady off-bias signal to a gate turn-off thyristor (GTO), comprising:
   a first controllable switch means responsive to a first external signal for generating said turn-off pulse;
   a second controllable switch means responsive to a second external signal for generating said steady off-bias signal;
   first diode means;
   second diode means; and
   a transformer having first and second primary windings and third and fourth secondary windings, each winding magnetically coupled to each other winding, said first winding coupled in series with said first controllable switch means and adapted to be coupled to a first external power supply for supplying current to said first winding, said third winding coupled in series with said first diode means across the gate-cathode terminals of said GTO, said third winding and said first diode means poled to provide a reverse gate current turn-off pulse to the GTO when said first controllable switch means conducts, said second winding coupled in series with said second controllable switch means, and adapted to be coupled to a second external power supply for supplying current to said second winding, and said fourth winding coupled in series with said second diode means across the gate-cathode terminals of said GTO, said fourth winding and said second diode means poled to provide the off-bias signal from magnetic energy in the transformer when one of said first and second controllable switch means is biased out of conduction.

2. A gate driver circuit for providing a turn-on pulse and a steady on-bias signal to a gate turn-off thyristor (GTO) comprising:
   a first controllable switch means responsive to a first external signal;
   a second controllable switch means responsive to a second external signal;
   first diode means;
   second diode means; and
   a transformer having first and second primary windings and third and fourth secondary windings, each winding magnetically coupled to each other winding, said first winding coupled in series with said first controllable switch means and adapted to be coupled to an external power supply for supplying current to said first winding, said third winding coupled in series with said first diode means across the gate-cathode terminals of said GTO, said third winding and said first diode means poled to provide the gate turn-on pulse to the GTO when said first controllable switch means conducts, said second winding coupled in series with said second controllable switch means, and adapted to be coupled to said external power supply for supplying current to said second winding, and said fourth winding coupled in series with said second diode means across the gate-cathode terminals of said GTO, said fourth winding and said second diode means poled to provide the on-bias signal when said second controllable switch means conducts, and said third winding and said first diode means poled to provide the on-bias signal from magnetic energy in the transformer when said second controllable switch means is biased out of conduction.

3. The gate driver circuit of claim 2 further comprising clamp means for short circuiting said first winding to permit subsequent turn-off of the GTO.

4. A method of applying a gate turn-off pulse and an off-bias voltage to a gate turn-off thyristor (GTO) using a dual mode dc converter having a four winding transformer with first and second primary windings, and third and fourth secondary windings, the third and fourth windings each connected in series with a respective diode and coupled across the gate-cathode terminals of the GTO, said method comprising the steps of:

generating a GTO turn-off pulse by providing a pulse of current in the first winding of the transformer so as to transfer energy by forward action to the third winding;

continuing said turn-off pulse after said pulse of current in the first winding has ended by flyback action to the fourth winding; and providing an off-bias voltage to the GTO by periodically pulsing current through the second winding and transferring energy by flyback action to the fourth winding.

5. A method of applying a gate turn on pulse and an on-bias gate current to a gate turn off thyristor (GTO) using a dual mode dc converter having a four winding transformer with first and second primary windings and third and fourth secondary windings, the third and fourth windings each connected in series with a respective diode and coupled across the gate-cathode terminals of the GTO, said method comprising the steps of:

generating a GTO turn-on pulse by providing a pulse of current in the first winding so as to transfer energy by forward action to the third winding;

continuing said turn-on pulse after said current pulse in the first winding has ended by transferring the magnetizing current in the first winding to the fourth winding by flyback action; and maintaining on-bias gate current by pulsing current through the second winding to transfer energy by forward action to the fourth winding and, in between current pulses supplied to the second winding, transferring electromagnetic energy to the third winding by flyback action.

6. The method of claim 5 further comprising the step of short-circuiting the first winding to remove on-bias current from the GTO in preparation for GTO turn-off.

7. A base driver circuit for providing a turn-on pulse to a bipolar transistor comprising:

a first controllable switch means responsive to a first external signal;

a second controllable switch means responsive to a second external signal;

first diode means;

switching means;

second diode means; and a transformer having first and second primary windings and third and fourth secondary windings, each winding magnetically coupled to each other winding, said first winding coupled in series with said first controllable switch means and adapted to be coupled to an external power supply for supplying current to said first winding, said third winding coupled in series with said first diode means across the base-emitter terminals of said transistor, said third winding and said first diode means poled to provide a base current turn-on pulse to the transistor when said first controllable switch means conducts, said second winding coupled in series with said second controllable switch means and adapted to be coupled to said external power supply for supplying current to said second winding, and said fourth winding coupled in series with said second diode means across said base-emitter terminals of said transistor, said fourth winding and said second diode means poled to provide the on-bias signal when said second controllable switch means conducts, and said third winding and said first diode means poled to provide the on-bias signal from magnetic energy in the transformer when said second controllable switch means is biased out of conduction, said switching means coupled across said base-emitter terminals of said transistor for short-circuiting said base-emitter terminals of said transistor to bias said transistor out of conduction when both of said third and fourth secondary windings are de-energized.

* * * * *